United States Patent [19]
Hilden et al.

[11] Patent Number: 5,271,016
[45] Date of Patent: Dec. 14, 1993

[54] SHIFT-CORRECTING CODE SYSTEM WITH EFFICIENT SYMBOL-TO-CHANNEL BIT TRANSFORMATION

[75] Inventors: Hugh M. Hilden, Honolulu, Hi.; Dennis G. Howe, Pittsford, N.Y.

[73] Assignee: Eastman Kodak Company, Rochester, N.Y.

[21] Appl. No.: 632,800

[22] Filed: Dec. 24, 1990

[51] Int. Cl.$^5$ .................. H03M 7/46; H03M 13/00; G11B 20/18

[52] U.S. Cl. .................. 371/37.1; 341/59; 341/9 A; 371/42

[58] Field of Search .............. 371/37.1, 40.1, 42; 341/59, 94

[56] References Cited

U.S. PATENT DOCUMENTS

| | | | |
|---|---|---|---|
| 4,769,818 | 9/1988 | Mortimer | 371/37.4 |
| 4,872,163 | 10/1989 | Follett et al. | 370/94.1 |

OTHER PUBLICATIONS

Johnson, H., "Providing Synchronization and Odd Parity", *IBM Technical Disclosure Bulletin*, vol. 14, No. 12, May 1972, p. 3714.

Bliss, W., "Circuitry for Performing Error Correction Calculations on Baseband Encoded Data to Eliminate Error Propagation", *IBM Technical Disclosure Bulletin*, vol. 23, No. 10, Mar. 1981, pp. 4633–4634.

Siegel, P., "Recording Codes for Digital Magnetic Storage", *IEEE Transactions on Magnetics*, vol. MAG-21, No. 5, Sep. 1985, pp. 1344–1349.

Davidson, M. et al., "High Density Magnetic Recording Using Digital Block Codes of Low Disparity", *IEEE Transactions on Magnetics*, vol. MAG-12, No. 5, Sep. 1976, pp. 584–586.

Schneider, H., "Disk System ICs Combat Data Errors", *Computer Design*, Mar. 1985, pp. 147–152.

Kalstrom, D., "Simple Encoding Schemes Double Capacity of a Flexible Disc", *Computer Design*, Sep. 1976, pp. 98–100.

*Primary Examiner*—Stephen M. Baker
*Attorney, Agent, or Firm*—William W. Holloway

[57] ABSTRACT

In a shift-correcting code which represents (d,k)-constrained run-length-limited (RLL) channel data as symbols drawn from $GF(p^m)$, the encoding process produces a set of redundant parity ternary $GF(p^m)$ symbols representing three shift error conditions: forward shift, backward shift and no shift, for $p=3$ and $m=1$ for example. The encoder of the invention transforms the parity symbols into (d,k)-constrained RLL channel bits to produce a binary data sequence that can be inserted in the RLL channel data stream without a large number of linking bits to maintain compliance with the (d,k) RLL constraints. A shift error in the RLL channel data representing parity symbols affects no more than one decoded parity symbol. The encoder of the invention efficiently transforms ternary symbols into (d,k)-constrained binary data by coding successive ternary symbols into one of six binary channel words in accordance with (a) the contents of the input ternary symbol and (b) the current state of the encoder, and sets its state to one of two states in preparation for encoding the next ternary symbol. In the first state, the encoder generates one of three channel words each comprising two bits preceded by b zeroes and in the second state generates one of three channel words each comprising two bits preceded by a one and b−1 zeroes, where b is related to d and k so as to maintain the (d,k)-constraints of a number of practically useful RLL codes.

31 Claims, 7 Drawing Sheets

A BLOCK SINGLE-SHIFT ERROR CORRECTING ECM ENCODER ( 2-STAGE )

FIG. 1

(1, 5) RLL TO TRITS DECODER

FIG. 10

(2, 7) RLL TO TRITS DECODER

A BLOCK SINGLE-SHIFT ERROR CORRECTING ECM ENCODER (2-STAGE)

FIG. 3

ONE STAGE OF A BLOCK SINGLE-SHIFT ERROR CORRECTING ECM DECODER

INPUT : X = X₁ X₀   ( X₁ IS MOST SIGNIFICANT BIT )
STATE : S
NEXT STATE : S'
OUTPUT : Y' = Y₂' Y₁' Y₀'   ( Y₂' IS MOST SIGNIFICANT BIT )

TRITS TO ( 1,5 ) RLL ENCODER

FIG. 4

TRITS TO ( 2,7 ) RLL ENCODER

TRITS TO ( 1,5 ) RLL ENCODE TABLE

FIG. 8

TRITS TO ( 2,7 ) RLL ENCODE TABLE

A b=d+1,k=b+3 TRIT TO ( 1,5 ) RLL ENCODE TABLE

FIG. 13

SHIFT-CORRECTING CODE SYSTEM WITH EFFICIENT SYMBOL-TO-CHANNEL BIT TRANSFORMATION

BACKGROUND OF THE INVENTION

1. Technical Field

The invention is related to shift-correction encoding systems which correct shift errors in data received from a channel by encoding the data prior to its transmission through the channel after it has been channel encoded. Such shift-correction encoding systems are disclosed in U.S. patent application Ser. No. 07/200,166 filed May 31, 1988 by Dennis George Howe, Edward Joseph Weldon and Hugh Michael Hilden entitled SHIFT-CORRECTING CODE FOR CHANNEL ENCODED DATA and assigned to the assignee of the present application (hereinafter referred to as the referenced patent application).

2. Background Art

The referenced patent application discloses a system in which shift errors in run-length-limited (RLL) channel encoded data are corrected using a shift-correction code system operating "inside" the RLL channel encoder/decoder system. RLL encoded data comprises a succession of "runs" of successive binary zeroes, adjacent runs being separated by a binary one. The value of each run is the number of zeroes in the corresponding run (or alternatively, one plus that number). Such RLL data is constrained in that the number of zeroes in each run must be at least d and no more than k, so that the RLL data is said to be (d,k)-constrained.

Briefly, the shift-correction code system encodes successive blocks, (one at a time) of RLL channel encoded data by appending to each block a check block of redundant (parity) RLL data prior to transmission of the data through a channel (e.g., recording of the data in a storage system). The check data is computed from a sequence of message symbols drawn from GF(p), where p is a prime number. These message symbols are computed from the contigious runs which comprise the input block of RLL data by first transforming each run into a cumulative sum of the values of all preceding runs in the block. This first transformation prevents individual shift errors in data transmitted through the channel from affecting more than one symbol of the shift-correction coded data block, which is a requirement of such shift-correction codes (which requirement will be referred to herein after as the "shift-correction-condition"). Then, each sum value is reduced modulo p, where the value p determines the type of shift errors which can be corrected by the shift-correction code. (In the usual case $p=3$, and the resulting ternary code symbols, which are called "trits", have as their value either $+1$, $-1$ or 0). The result of these operations is the representation of the input block of channel data as a block of elements drawn from an alphabet of cardinality p (ie., from GF[p]).

The message block of Galois field symbols thus generated is then encoded in accordance with a suitable code over $GF(p^m)$ (where m is a non-zero integer) to generate a corresponding block of redundant check symbols. The check symbols are then transformed to binary data which conforms to the (d,k) constraints of the RLL channel code. It is this last transformation to which the present invention is directed.

This binary data is then appended to the original message RLL channel data as the redundant "check" channel data. When such shift-correction encoded blocks of channel data are received from the channel, a shift-correction decoder detects the presence of any shift errors introduced by the channel into the data by simply inspecting the syndrome of the received shift-correction coded data block and may correct such errors using error locator and error evaluator polynomials in accordance with well-known techniques.

In essence, if $p=3$ a one bit shift in the position of a binary one separating two adjacent runs of zeroes in the RLL channel encoded data received from the channel is detected by the presence of a trit of value either $+1$ or $-1$ in the error evaluator polynomial of the affected codeword, depending upon whether the shift was a "forward" shift or a "backward" shift. By adding this non-zero trit value to the appropriate trit in the codeword and then transforming the codeword back to RLL-constrained binary data, the correct RLL data sequence is produced in which the binary one which was originally shifted is restored to its correct position. Alternatively, since each element of the error evaluator polynomial corresponds uniquely to a particular run in the RLL data received from the channel, shift error correction could be done directly by appropriately shifting "ones" corresponding to non-zero elements of the error evaluator polynomial.

Problem to be solved by the Invention

In what follows, we shall assume $p=3$; the shift correction code symbols are thus "trits". As mentioned above, after the block of redundant check symbols (in the form of "trits") have been computed from the message trits representing the input block of RLL channel-encoded data, the check symbols—parity trits—must be transformed into RLL binary data in order that they may be appended to the input message RLL channel encoded data and transmitted with it through the channel. As described in the above-referenced patent application, this process is fraught with several significant problems. First, depending upon the value of the last bit in the block of original input RLL channel encoded data and the value of the first bit in the block of redundant RLL data, simply catenating the two blocks together may cause a violation of the (d,k) constraints of the RLL channel code. In order to avoid violating these constraints, a set of link bits may be interposed between the "message" block of the original RLL channel-encoded data and the "check" block of redundant RLL data. These link bits must be carefully computed in accordance with the last several (e.g., two) bits of the message block, as described on page 22 of the above-referenced patent application. Furthermore, since the present "check" block is immediately followed by the next "message" block in the RLL data stream sent to the channel, another violation of the RLL (d,k) constraints must be guarded against by placing another set of link bits at the end of each RLL encoded check block.

In the case when the shift-correction encoded blocks of channel data are to be of fixed length, obtaining the link bits is particularly problematical because of the complex considerations entailed in their computation. For example, generating check blocks of uniform length (in terms of RLL bits) as described in the above-referenced patent application at page 25 lines 6 through 33, involves several computational steps. First, each redundant parity trit s' generated by the shift-correction encoder must be transformed in accordance with the inverse of the cumulative sum transformation mentioned above. In the inverse transformation, each trit s' is treated as if it were a cumulative sum of values of the preceding and current RLL runs x' reduced modulus p. The inverse transformation obtains the value of each current RLL run x'. This run is then converted to a binary sequence x by assigning run values d, d+1 and d+2 to x' values of 0, 1 and −1, respectively. Then, the number of channel bits comprising the binary sequences x representing all of the redundant parity trits of the current block must be computed. (This number is simply the cumulative number of zeroes in the binary RLL representation of the check block plus the number of ones separating successive run symbols.)

This result is subtracted from the desired length of the check block; the difference is the number of link bits (binary zeroes) that are to be appended to the binary RLL representation of the current check block of redundant parity symbols. If the number of these link bits is too large (e.g., if the total number of zeroes in the last run of the check block is greater than k), then another RLL run symbol must be appended to the check block.

This entire process, particularly the inverse transformation from s' symbols to x' symbols, is time consuming and/or requires hardware investment Another problem is that the shift-correction decoder must locate and discard the link bits before decoding. Otherwise, it will misdecode. Since the number of link bits at the end of each check block changes with the content of the data, tracking and locating the link bits is a computational task and represents overhead in both operational time and dedicated hardware.

Another limitation of the methods taught in the above-referenced patent application concerns coding rate. The aggregate number of channel bits required to represent each redundant check block as a uniform (fixed) length RLL bit sequence conforming to the RLL code's (d,k) constraints is quite large relative to the number of bits that would correspond to the theoretical maximum encoding rate between trit symbols and RLL (d,k)-constrained binary symbols. To demonstrate this, we consider the coding of trits to (2,7)-constrained binary sequences. The maximum theoretical rate at which this can be accomplished is $R = \log_3(1.431) \approx 0.326 \approx 8/25$ trits/bit. In the example on page 25 of the above-referenced patent application, a "shift-correction-condition" compliant encoding scheme is disclosed in which four parity trits are represented by 22 channel bit long (2,7)-constrained sequences, a coding rate of 4/22. To the extent that these coding rates are lower than the theoretical maximum coding rate for such a transformation, they represent a limitation on system performance.

It is an object of the invention to provide a shift-correction condition compliant method for transforming a sequence of parity trits into a fixed length binary RLL sequence which automatically obeys specified (d,k) constraints.

It is a further object of the invention that the binary RLL sequence thus formed can be spliced into an arbitrary location in a d,k-constrained binary sequence without the use of link bits and without requiring the inverse transformation from the trit symbols s' to the binary symbols x' to effect shift correction encoding. This feature requires less computation and simpler hardware to implement.

It is a yet further object of the invention to accomplish this while achieving a high shift-correction code rate.

DISCLOSURE OF THE INVENTION

In a shift-correction encoder, parity trits computed from the trits representing a "message" block of RLL channel data are transformed to RLL binary data comprising the "check" block of RLL data by the parity trit transformation encoder of the present invention. In a shift-correction decoder, the "check" block RLL data portion of a received block of shift-correction encoded RLL data is transformed to parity trits by the parity-trit-transformation decoder of the present invention.

The parity-trit-transformation encoder transforms each input parity trit to a fixed length channel word in accordance with its current state and then sets its state to one of two state values in preparation for encoding the next input parity trit. One embodiment of such an encoder is given in Table I below.

In the first three rows of Table I, the present state of the encoder is $S_0$ and the channel word is two bits preceded by a run of b zeroes. In the last three rows of the table, the present state of the encoder is $S_1$ and the channel word is two bits preceded by a binary one and a run of b−1 zeroes.

TABLE I

| Present State | Trit | Channel Word | Next State |
|---|---|---|---|
| $S_0$ | 0 | .....(b zeroes)..00 | $S_1$ |
| $S_0$ | 1 | .....(b zeroes)..01 | $S_0$ |
| $S_0$ | 2(=−1) | .....(b zeroes)..10 | $S_0$ |
| $S_1$ | 0 | 1...(b−1 zeroes)..00 | $S_1$ |
| $S_1$ | 1 | 1...(b−1 zeroes)..01 | $S_0$ |
| $S_1$ | 2(=−1) | 1...(b−1 zeroes)..10 | $S_0$ |

The "check" block of RLL parity data obtained via Table I may be directly appended to an arbitrarily ending "message" block of RLL channel encoded data without inserting intervening linking bits between the two blocks if one uses the last d bits of the message block of RLL data to initialize (i.e., set the starting state) of the Table I encoder as follows:

If the message block ends with <d zeroes, then the initial state is set to $S_0$; if the message block ends with ≧d zeroes, the initial state is set to $S_1$.

Inspection of Table I and particularly the sixth row thereof shows that b−1 must be equal to d in order to maintain the RLL code's d constraint; also, the maximum number of consecutive output channel zeroes is b+3 (which occurs in response to the input trit sequence 2,0,x, where x is any of 0, 1, or 2). Thus, the natural k constraint of the Table I encoder's output is $k_p = b + 3 = d + 4$. However, a different k constraint may occur when the message and check blocks of RLL data are merged via the above stated initialization rules. Specifically, if the message block of RLL data ends with a run of d−1 contiguous zeroes and the first parity trit has value 0, then exactly (d−1)+b+2=2d+2 contiguous output channel zeroes will occur. A shorter run of output channel zeroes will result if the message RLL block ends with less than d−1 zeroes, regardless of the value of the first parity trit. Also, if the message block ends with d or more zeroes, the maximum run of zeroes will be equal to the k constraint value of the RLL channel code being used.

We now consider the merging of the RLL parity data with the next message block. Clearly, if the final parity trit is a 1 (or 2) and the next message block begins with fewer than d (or fewer than d−1) contiguous zeroes, an RLL code d constraint violation will occur. Similarly, an RLL code k constraint violation would occur if the check block of RLL data ends with $k_p$ zeroes and the next message block starts with more than $k_m-k_p$ contiguous zeroes, where $k_m$ is the k constraint of the RLL code. The RLL code d constraint, and a useful k constraint, can be maintained by using the Table I encoder to send one extra "linking" channel word after encoding the final parity trit according to the following rules:

If the next message block begins with $\geq$d zeroes, send a linking channel word that corresponds to a trit value of 1; if the next message begins with exactly d−1 zeroes, the link trit value 2 is used; the link trit value is 0 if the next message begins with fewer than d−1 zeroes.

From Table I, it can be seen that the maximum number of contiguous zeroes that can occur if shift-correction coded RLL data words are linked via the above strategy is the larger of $k_m$ or 2d+2, which is similar to what occurs when we use the previously stated Table I encoder initialization rules to effect merging of the RLL channel data realizations of the message and check parts of a shift-correction codeword. The intraword merging and interword linking rules described above are summarized in Table IA.

TABLE IA

| Initialization of Table I Encoder: | | |
|---|---|---|
| Message Block Ending | Encoder Initial State | Max No. of Contiguous Zeroes That May Occur |
| <d zeroes | $S_0$ | (d−1) + b + 2 = 2d + 2 |
| $\geq$d zeroes | $S_1$ | $k_m$ |
| Merging of Codewords via Table I Encoder: | | |
| Next Message Beginning | Interword Link Trit | Max No. of Contiguous Zeroes That May Occur |
| $\geq$d zeroes | 1 | $k_m$ |
| d−1 zeroes | 2 | d |
| $\leq$d−2 zeroes | 0 | (b+3) + d − 2 = 2d+2 |

The k constraint of the RLL channel data that results from a shift-correction encoder that employs the trit-to-binary-RLL encoder described by Tables I and IA will therefore be the larger of 2d+2, $k_p$ or $k_m$. Values of 2d+2 and $k_p$=d+4 as a function of d are listed in Table IB.

TABLE IB

| d | 2d + 2 | d + 4 |
|---|---|---|
| 1 | 4 | 5 |
| 2 | 6 | 6 |
| 3 | 8 | 7 |
| 4 | 10 | 8 |
| 5 | 12 | 9 |

Table IB shows that, e.g., both (1,7) and (2,7) RLL coding constraints could be maintained by a fixed channel block length shift-correction encoder that employed the trit-to-binary-RLL encoder described by Tables I and IA. This is because, in the Table I code b=d+1, and each channel word has length b+2=d+3 bits. Thus, the intrinsic rate of the Table I code is 1/(d+3) trits/bit. A trit to d,k-constrained binary encoder with a higher intrinsic rate can be obtained by changing only the sixth row of Table I; this encoder is described by Table II below.

The d constraint of the channel data produced by the code described by Table II is d=b, its intrinsic k constraint is $k_p$=2d+3 and its intrinsic rate is 1/(d+2) trits/bit. If the same encoder initialization strategy and block linking strategy (fixed length channel data blocks) that was used with the Table I code is employed with the Table II code, the maximum number of contiguous zeroes that may occur are as given in Table IIA below.

TABLE II

| Present State | Trit | Channel Word | Next State |
|---|---|---|---|
| $S_0$ | 0 | ...(b zeroes)..00 | $S_1$ |
| $S_0$ | 1 | ...(b zeroes)..01 | $S_0$ |
| $S_0$ | 2 | ...(b zeroes)..10 | $S_0$ |
| $S_1$ | 0 | 1..(b−1 zeroes)..00 | $S_1$ |
| $S_1$ | 1 | 1..(b−1 zeroes)..01 | $S_0$ |
| $S_1$ | 2 | ...(b zeroes)..10 | $S_0$ |

TABLE IIA

| Initialization of Table II Encoder: | | |
|---|---|---|
| Message Block Ending | Encoder Initial State | Max No. of Contiguous Zeroes That May Occur |
| <d zeroes | $S_0$ | (d−1) + (b+2) + b = 3d+1 |
| $\geq$d zeroes | $S_1$ | $k_m$ + b = d + $k_m$ |
| Merging of Codewords via Table II Encoder: | | |
| Next Message Beginning | Interword Link Trit | Max No. of Contiguous Zeroes That May Occur |
| $\geq$d zeroes | 1 | $k_m$ |
| d−1 zeroes | 2 | d |
| $\leq$d−2 zeroes | 0 | (d−2) + (b+3) = 2d+1 |

Table IIA shows that the Table II code will produce channel data that has a k constraint of 3d+1 or d+$k_m$, whichever is larger. This k constraint can be reduced by using the Table I encoder to encode the first parity trit, or the first and second parity trits, and using the Table II encoder to encode the third and succeeding parity trits. This is shown in Table IIB below.

TABLE IIB

| 1st Trit via Table I Encoder; Succeeding Trits Via Table II Encoder: | | |
|---|---|---|
| Message Block Ending | Table I Encoder Initial State | Max No. of Contiguous Zeroes That May Occur |
| <d zeroes | $S_0$ | (d−1) + (d+3) + d = 3d+2 |
| $\geq$d zeroes | $S_1$ | $k_m$ |
| 1st and 2nd Trit via Table I; Succeeding Trits Via Table II: | | |
| Message Block Ending | Table I Encoder Initial State | Max No. of Contiguous Zeroes That May Occur |
| <d zeroes | $S_0$ | (d−1) + (d+3) = 2d + 2 |
| $\geq$d zeroes | $S_1$ | $k_m$ |

Using this last strategy, we may use the Table I and Table II trit-to-binary-RLL encoders as parts of a fixed channel block length shift-error-correction encoder which maintains a k constraint which is the same as that listed in the second column of Table IB. Such an encoder has total channel bit overhead given by (r+1)(d+2)+2 channel bits, where r is the number of parity trits required by the base ternary shift-correcting code. Thus the trit-to-binary-RLL encoder of the present invention is at least as efficient as the method used to map parity trits to channel data in the above-referenced patent application, but requires less computational overhead to effect both encoding and decoding.

The parity-trit-transformation decoder operates by discarding the first b bits of the channel word and deducing the correct trit value from the remaining two bits in accordance with Table I (or Table II).

Finally, it is noted that the parity-trit-transformation encoders/decoders of the present invention can also be used in conjunction with variable channel block length shift-correction codes. Such codes always contain a fixed number of entire runs of channel data in their message part. Thus, the message part always ends with $\geq d$ zeroes and $\leq k_m$ zeroes, and the succeeding message channel block always begins with a one. Accordingly, the first parity trit should be encoded via Table I (using initial state $S_1$), succeeding parity trits are encoded via Table II, and one channel word corresponding to trit value 0 is used for interword linking. The k value of the channel data thus obtained will be the larger of $2d+3$ or $k_m$ and the total overhead (the channel bit realization of the parity part of the shift-correction codeword) will be $(r+1)(d+2)+1$ channel bits, where r is as defined earlier.

The use of a variable number of calculated link bits separating successive "check" blocks and "message" blocks may be dispensed with using the parity-trit-transformation encoder and decoder of the invention. Appending the channel words generated by the parity-trit-transformation encoder directly to the "message" block of RLL channel encoded data will maintain certain d,k constraints in the resulting RLL channel code. That this is so will be shown in connection with a specific example given in the detailed description below.

The use of the inverse transformation from the s' symbols to the x' symbols is dispensed with, greatly simplifying the process of generating the "check" block of RLL parity bits. As a result, the process is faster and uses much simpler hardware Such a transformation is not necessary in the present invention to guarantee fulfillment of the shift-correction-condition because (as mentioned previously) a single shift error cannot propagate from channel word to channel word because the two bits in each channel word that represent a trit value are isolated by an independently calculated set of b bits.

The encoding rate at which parity trits are transformed to channel bits is as high or higher than that previously achieved in the above-referenced patent application. In other words, fewer channel bits are required to represent each redundant parity trit or ternary check symbol. This will be shown in connection with a specific example in the detailed description given as follows.

BRIEF DESCRIPTION OF THE DRAWINGS

The invention may be understood by reference to the accompanying drawings, of which.

MODES FOR CARRYING OUT THE INVENTION

Figure 1:
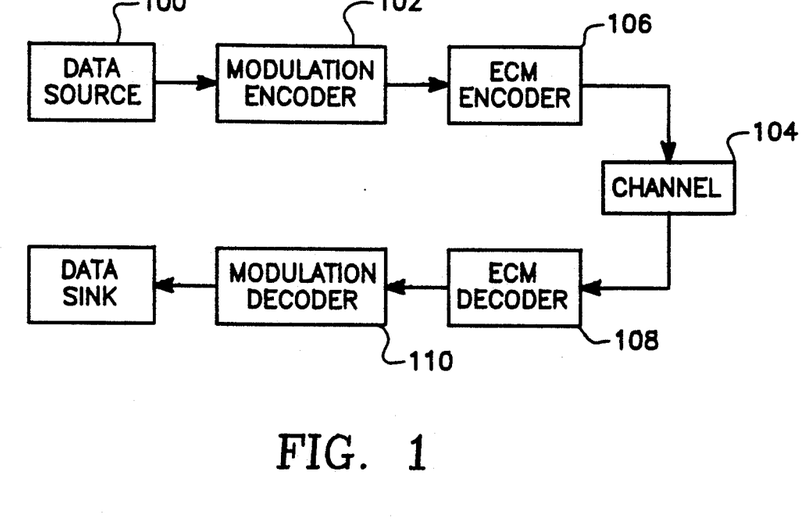
FIG. 1 is a block diagram of a shift-correction encoding/decoding system in which the invention is employed.

Referring to FIG. 1, data from an information source 100 is encoded by a modulation or channel encoder 102 in accordance with an RLL (d,k)-constrained code for transmission as "message" data through a channel 104 (such as an optical disk data storage system, for example). As described in the above-referenced patent application, an error-correcting-modulation (ECM) encoder 106 (also referred to herein as a shift-correction encoder) sections the message data into blocks and computes a "check" block of redundant data from each "message" block and appends the check block to its corresponding message block prior to transmission through the channel 104. The data is retrieved from the channel 104 (for example, by playing back recorded data from an optical disk data storage system) by first decoding it in an error-correcting-modulation (ECM) decoder 108 (also referred herein as a shift-correction decoder). The ECM decoder 108 detects and may correct errors in the message block of RLL encoded data and then (in the case of error correction) transmits the corrected message block to a modulation or channel decoder 110. The channel decoder 110 transforms the RLL channel data into binary data and transmits the binary data to a data sink 112.

Figure 2:
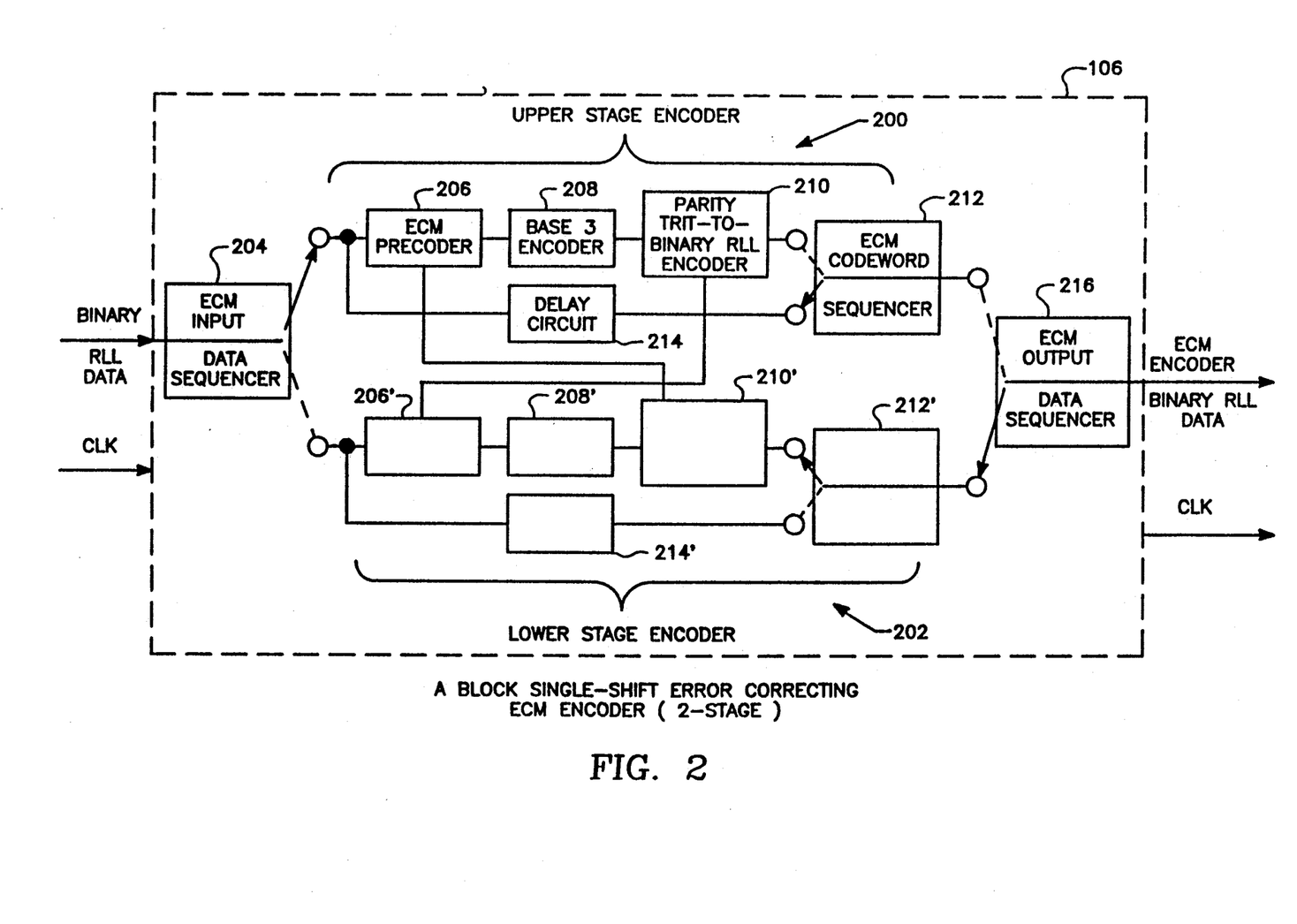
FIG. 2 is a block diagram of a shift-correction encoder in the system of FIG. 1 including the parity-trit-transformation encoder of the present invention.

In accordance with the present invention, the ECM encoder 106 of FIG. 1 includes a parity-trit-transformation encoder which improves the shift-correction code system described in the above-referenced patent application. FIG. 2 is a block diagram of the ECM encoder 106 of FIG. 1 embodying the present invention. The ECM encoder 106 has duplicate upper and lower stages 200, 202, to which alternate message blocks of RLL encoded data are sent by an input data sequencer 204. The upper stage 200 will now be described.

An ECM precoder 206 transforms the received RLL binary data stream of successive RLL symbols $x_i$ (or "runs") into a sequence of K ternary symbols $s_i'$ or "trits". The ECM precoder 206 of FIG. 2 performs the functions of blocks 30, 32 and 34 of FIG. 4 of the above-referenced patent application. Referring again to FIG. 2 of the present application, a base 3 encoder 208 calculates a set of N−K redundant parity trits from the K trits generated by the ECM precoder 206 in accordance with a ternary code (such as a ternary BCH code). The base 3 encoder 208 of FIG. 2 performs the function described in FIG. 4 of the above-referenced patent application, and particularly by blocks 36 and 38 of FIG. 4 of the above-referenced patent application. Next, these parity trits must be converted to RLL binary data as a "check" block to be appended to the RLL data "message" block received from the input data sequencer 204.

The above-referenced patent application teaches a fairly complex process for obtaining the RLL check block. This process involves solving a set of N−K simultaneous equations to inverse-transform the s' symbols to x' symbols (block 40 of FIG. 4 of the above-referenced patent application), changing each x' symbol to an RLL bit sequence (block 42 of FIG. 4 of the above-referenced patent application) and appending a set of link bits to the block of parity bits to avoid RLL (d,k) constraint violations (block 43 of FIG. 4 of the above-referenced patent application). The present invention is a process for accomplishing the same thing more efficiently without requiring the solution of simultaneous equations and without requiring the computation and appending of link bits.

The elements described in the foregoing paragraph are replaced in the present invention by a simple and highly efficient parity-trit-transformation encoder 210 (or "trit-to-binary-RLL encoder") connected to the output of the base 3 encoder 208. As will be described below, the transformation encoder 210 generates a sequence of RLL-constrained bits from the N-K parity trits computed by the encoder 208. The transformation encoder 210 also receives the value of the first run of the next message block from the precoder 206' of the complementary stage to obtain the value of the codeblock merging trit and corresponding RLL bits. This entire sequence of RLL-constrained bits comprises the "check" block of RLL bits which is to be appended to the "message" block of RLL its received from the input data sequencer 204. An ECM codeword sequencer 212 receives the check block from the transformation encoder 210 and receives the message block through a delay 214 from the input data sequencer 204. The sequencer 212 transmits at its output the message block followed by the check block, the message and check blocks together corresponding to an ECM codeword of length N trits transformed into RLL data.

While the upper stage 200 processes one message block of RLL encoded data, the lower stage 202 is processing (i.e., receiving) the next block, the two stages 200, 202 thus working in tandem. The input data sequencer 204 therefore routes alternate message blocks to the upper stage 200 and to the lower stage 202. The lower stage 202 is identical to the upper stage 200 in that it has its own precoder 206', base 3 encoder 208', parity-trit-transformation transformation encoder 210', ECM codeword sequencer 212' and delay 214'. An ECM output data sequencer 216 alternately receives the ECM-coded RLL data blocks consisting of message and check block pairs from each of the two stages 200, 202 and transmits a stream of such ECM-coded RLL data blocks to the channel 104 (FIG. 1).

Figure 3:
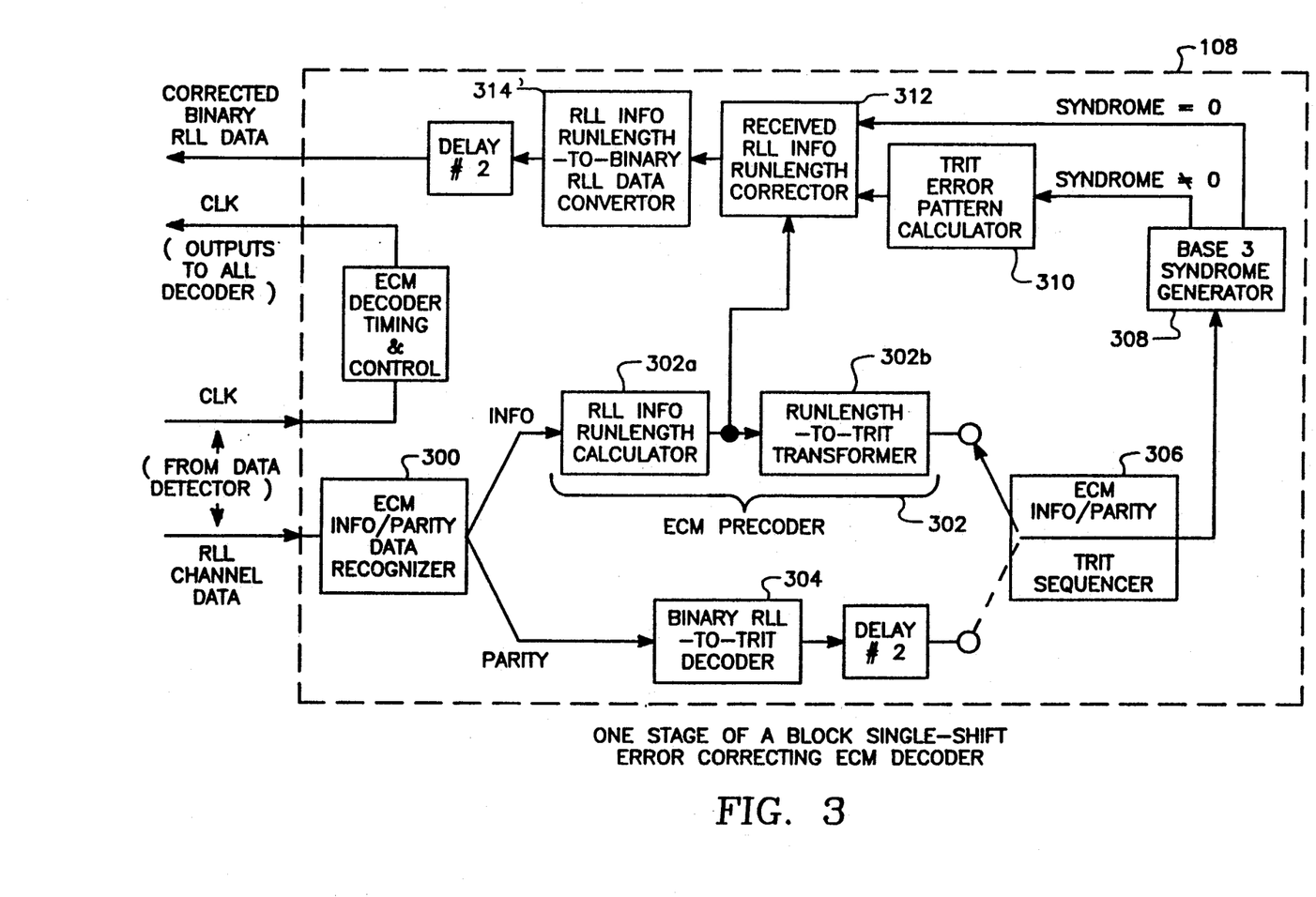
FIG. 3 is a block diagram of a shift-correction decoder in the system of FIG. 1 including the parity-trit-transformation decoder of the present invention.

In accordance with the invention, the ECM decoder 108 of FIG. 1 includes a parity-trit-transformation decoder which enhances system performance relative to that achieved in the shift-correction code system described in the above-referenced patent application. FIG. 3 is a block diagram of an ECM decoder embodying the present invention. A message/parity data recognizer 300 receives each ECM-coded channel data block from the channel 104 and separates the data block into a message block part and a check block part, using techniques well-known in the art. The recognizer 300 transmits the message block to an ECM precoder 302 which is identical to the precoder 206 of FIG. 2. The precoder 302 includes an RLL run-length calculator 302a and a run-length-to-trit transformer 302b, the functions of which have been described above in connection with the ECM precoder 206 of FIG. 2. Essentially, the run-length calculator 302a generates a number equal to the value (length) of each RLL data run The transformer 302b converts these values to a sequence of trits by accumulating the run values and reducing the accumulated sum mod 3, as previously described. The result is K "message" trits, which form part of the received ECM codeword which is to be decoded and possibly corrected.

The remainder of the ECM codeword, namely the parity trits $s_i'$, must be computed from the sequence of bits that comprise the "check" block of RLL data. In the above-referenced patent application, this is accomplished by a process which, essentially, is the inverse of that described above for transforming RLL run symbols $x_i$ to the parity trits $s_i'$, except that it also requires locating and discarding the link bits. This process is described in connection with block 60 of FIG. 5 of the above-referenced patent application. This process requires either additional operation time or investment of dedicated hardware or both, and therefore is an impediment to system performance and efficiency.

In accordance with the present invention, the operations of the foregoing paragraph are replaced by a much simpler and more efficient parity-trit-transformation decoder 304 (FIG. 3) which, in essence, performs the inverse of the process performed by the parity-trit-transformation encoder 210 of FIG. 2. As will be described below, the transformation decoder 304 transforms fixed length RLL data sequences into trits without having to accumulate sums and/or perform mod 3 reductions. Moreover, since the transformation encoder 210 of FIG. 2 appended no variable length link bit sequences between the message and check block channel data, or between the check block and next message block, the transformation decoder is not required to track or remove any such link bits, a significant advantage.

The parity trits generated by the transformation decoder 304 and the message trits generated by the precoder 302 are routed sequentially by an ECM message/parity trit sequencer 306 to a base-3 syndrome generator 308. The block of message trits and the block of parity trits, together, comprise an ECM codeword whose syndrome is computed by the syndrome generator 308 by, for example, dividing the codeword by the same codeword generator polynomial employed by the encoder 208 of FIG. 2, in accordance with well-known techniques. This function is the same as that described in the above-referenced patent application in connection with block 64 of FIG. 5 of that application.

If the syndrome computed by the syndrome generator 308 is non-zero, a trit error pattern calculator 310 determines the pattern of errors in the coded block of RLL data from the syndrome and transmits this pattern to a run-length corrector 312. The run-length corrector 312 takes the message block RLL run symbol values from the RLL run-length calculator 302a and corrects them by applying the error pattern computed by the trit error pattern calculator 310. Then, the corrected RLL run symbol values are converted to actual RLL data bit sequences by an RLL run-length-to-binary RLL data converter 314. This process corresponds to blocks 66, 68, and 80 of FIG. 5 of the above-reference patent application. The result is a corrected message block of RLL data.

Structure of the Parity-Trit-Transformation Encoder

Figure 4:
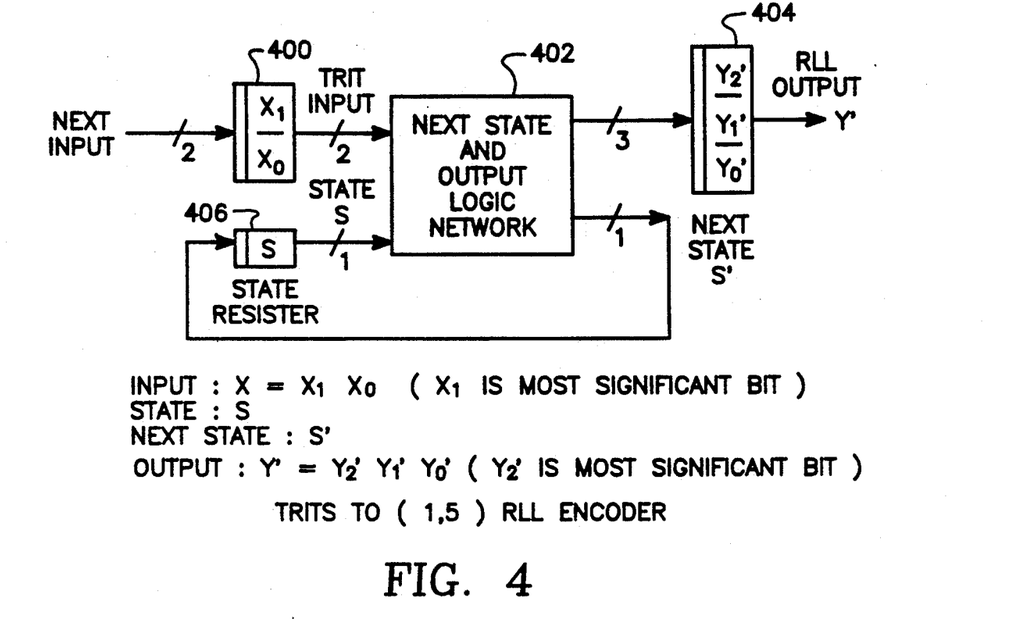
FIG. 4 is a block diagram of a parity-trit-transformation encoder which transforms parity trits to bits in accordance with an RLL(1,5) channel code.
Figure 5:
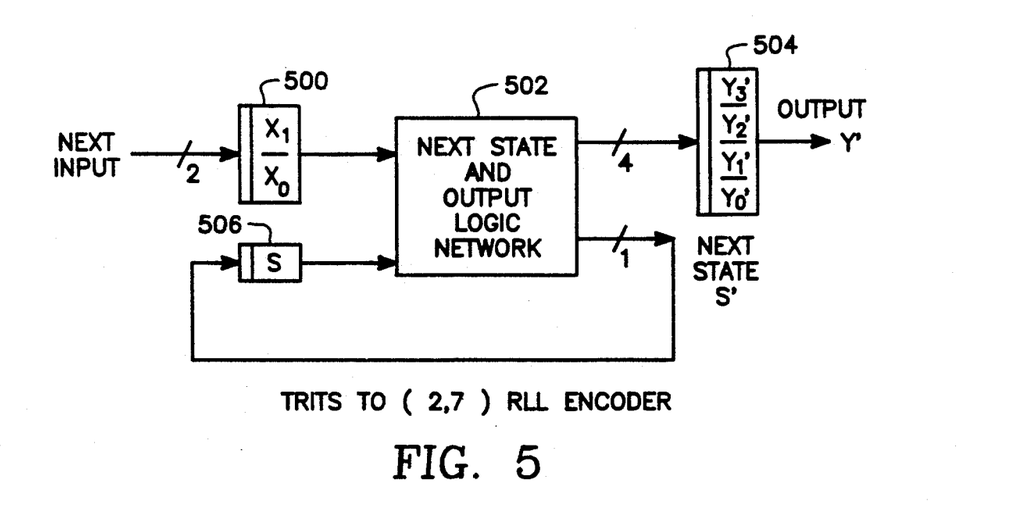
FIG. 5 is a block diagram of a parity-trit-transformation encoder which transforms parity trits to bits in accordance, with an RLL(2,7) channel code.

The structure of the transformation encoder 210 depends upon the (d,k) constraints of the RLL code. As tutorial examples, FIGS. 4 and 5 illustrate transformation encoders for converting trits to RLL binary sequences that satisfy (1,5) and (2,7) constraints, respectively. The ternary symbol or trit has three possible values and therefore is represented by two bits $X_1$ and $X_0$. The (1,5) RLL transformation encoder of FIG. 4 transforms each trit into three bits $Y_2'$, $Y_1'$, $Y_0'$ (FIG. 4), while the (2,7) RLL transformation encoder transforms each trit into four bits $Y_3'$, $Y_2'$, $Y_1'$, $Y_0'$ (FIG. 5). In addition to the two input bits $X_1$, $X_0$ representing the trit, the transformation encoder receives a logic state signal S from a state register defining the current state of the encoder as being one of two states. The encoder sets the state register to the next state (which may be the same as the previous state) in preparation for the encoding of the next trit.

Referring to FIG. 4, the (1,5) transformation encoder includes a two-bit (trit) input register 400 connected to one two-bit input of a logic network 402 and a three-bit RLL data output register 404 connected to a three-bit output of the network 402. A one-bit state register 406 has its output connected to a one-bit state input of the network 402 and its input connected to a one-bit state output of the network 402.

Referring to FIG. 5, the (2,7) transformation encoder includes a two-bit input (trit) register 500 connected to one two-bit input of a logic network 502 and a four-bit RLL data output register 504 connected to a four-bit output of the network 502. A one-bit state register 506 has its output connected to a one-bit state input of the network 502 and its input connected to a one-bit state output of the network 502. In both FIGS. 4 and 5, $Y_0'$ is the least significant bit.

Figure 6:
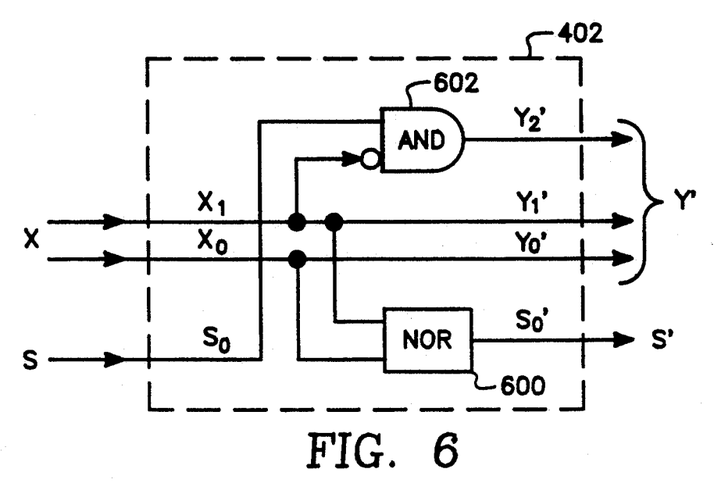
FIG. 6 is a logic diagram of the encoder of FIG. 4.

An exemplary structure of the logic network 402 of FIG. 4 which implements the code of Table II is illustrated in FIG. 6. The two inputs $X_0$, $X_1$ are received by a NOR gate 600 whose output is the next state logic signal S'. This feature ensures that the next state S' of the encoder is controlled exclusively by the value of the current trit and is unaffected by the current state S. The current state logic signal S (from the state register 406 of FIG. 4) controls one input of an AND gate 602 while the logical inverse of the bit $X_1$ controls the other input of the AND gate 602. The output of the AND gate 602 is the RLL output bit $Y_2'$, the input bit $X_1$ is the RLL output bit $Y_1'$ and the input bit $X_0$ is the RLL output bit $Y_0'$. The operation of the logic network 402 of FIG. 6 is summarized by the table of FIG. 8. Comparing FIG. 8 with Table II above, it is seen that the transformation encoder of FIG. 4 is a special case of the general transformation encoder of Table II in which the number b of appended bits equals 1.

Figure 7:
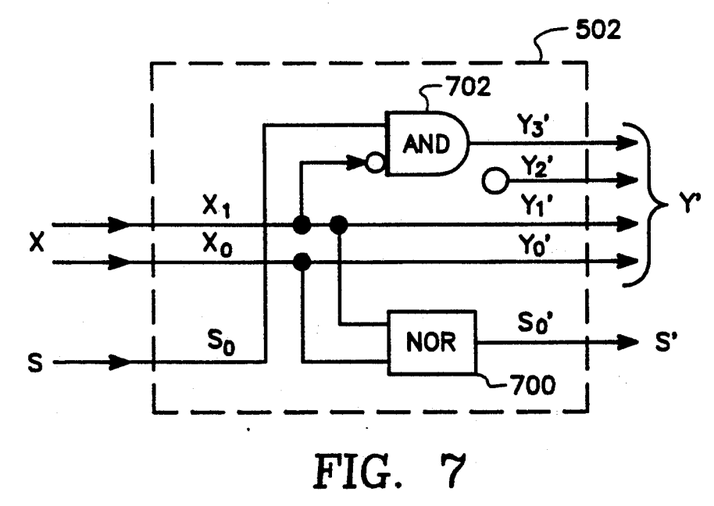
FIG. 7 is a logic diagram of the encoder of FIG. 5.

The structure of the logic network 502 of FIG. 5 is illustrated in FIG. 7. The two inputs $X_0$, $X_1$ are received by a NOR gate 700 whose output is the next state logic signal S'. The current state logic signal S (from the state register 506 of FIG. 5) controls one input of an AND gate 702 while the logical inverse of the bit $X_1$ controls the other input of the AND gate 702. In the logic network 502 of FIG. 7, the output of the AND gate 702 is the RLL output bit $Y_3'$, the input bit $X_1$ is the RLL output bit $Y_1'$ and the input bit $X_0$ is the RLL output bit $Y_0'$. The output bit $Y_2'$ is always zero. The operation of the logic network 502 of FIG. 7 is summarized by the table of FIG. 9. Comparing FIG. 9 with Table II above, it is seen that the transformation encoder of FIG. 5 is a special case of the general transformation encoder of Table II in which the number b of appended bits equals 2.

Figure 8:
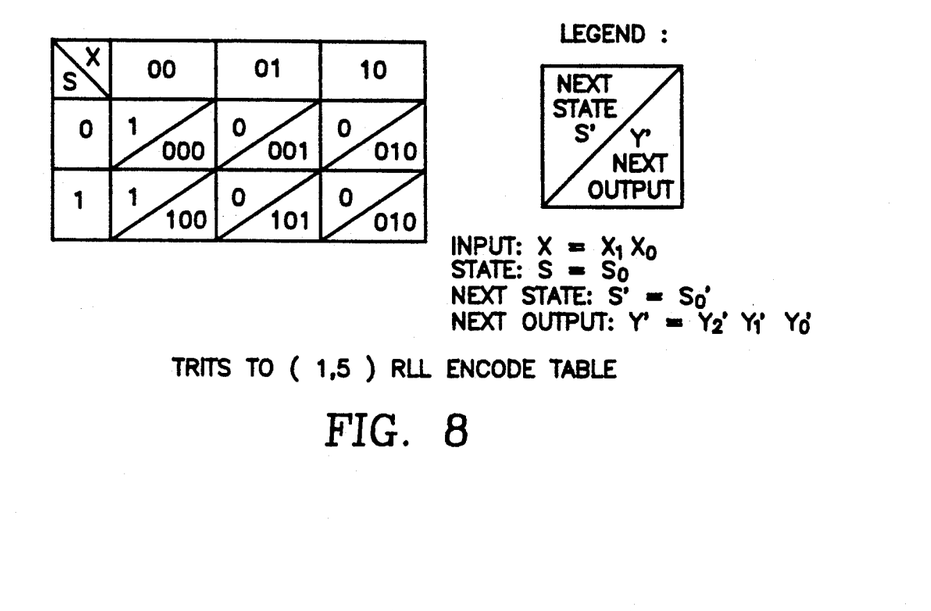
FIG. 8 is a table illustrating the operation of the encoder of FIG. 4.
Figure 9:
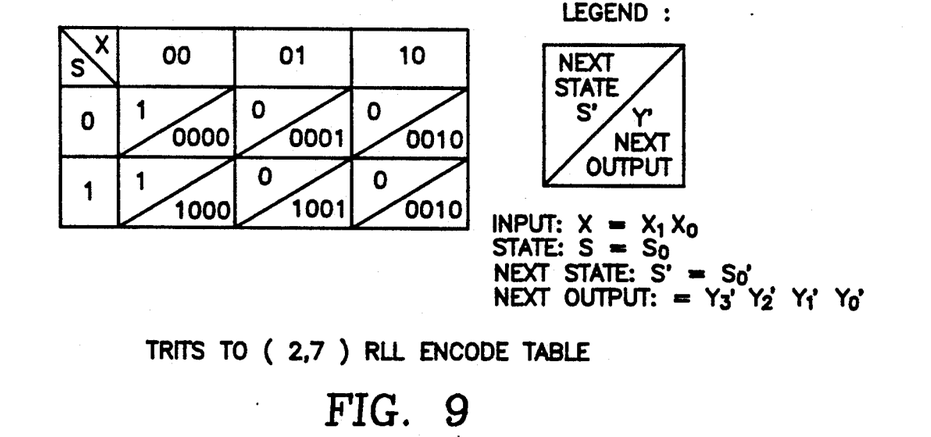
FIG. 9 is a table illustrating the operation of the encoder of FIG. 5.

The output binary bits illustrated in FIGS. 8 and 9 define the sequence of binary bits, i.e., the fixed length channel words, generated by the respective encoders. That such sequences do not violate the d constraint of the RLL code may be verified by considering all possible pairs of channel words generated by the parity-trit-transformation encoder. To verify that the stated k constraint is never violated, it is enough to consider all possible triples of channel words generated by the parity-trit-transformation encoder with the middle word being all zeroes.

Figure 10:
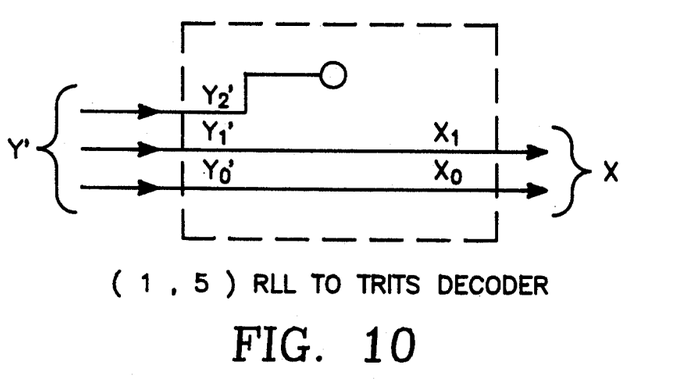
FIG. 10 is a logic diagram of a parity-trit-transformation decoder for use in conjunction with the encoder of FIG. 4.
Figure 11:
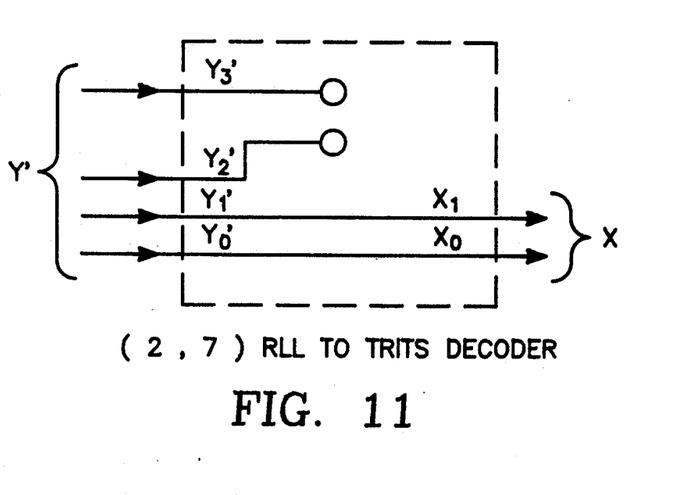
FIG. 11 is a logic diagram of a parity-trit-transformation decoder for use in conjunction with the encoder of FIG. 5.

As mentioned previously in connection with the general cases of Tables I and II, decoding the RLL data words generated by the parity-trit-transformation encoding process of Tables I and II requires a decoder which simply strips away the first b bits of the channel word and deduces the appropriate trit value from the last two bits of the channel word. It will be remembered that trit 0 always causes the last two channel bits to be 00, trit 1 causes the last two channel bits to be 01 and trit 2 causes the last two channel bits to be 10, which is precisely the representation of these trits in binary symbols. Thus, no action is required in decoding other than to strip away the first b bits of each channel word to arrive at the binary representation of the encoded trit. Accordingly, the (1,5) parity trit decoder illustrated in FIG. 10 discards the most significant RLL bit $Y_2'$ and maps the remaining RLL bits $Y_1'$ and $Y_0'$ to the (trit) bits $X_1$ and $X_0$ respectively. Similarly, the (2,7) parity trit decoder illustrated in FIG. 11 discards the most significant RLL bits $Y_2'$ and $Y_3'$ and maps the remaining RLL bits $Y_1'$ and $Y_0'0$ to the (trit) bits $X_1$ and $X_0$, respectively.

Figure 12:
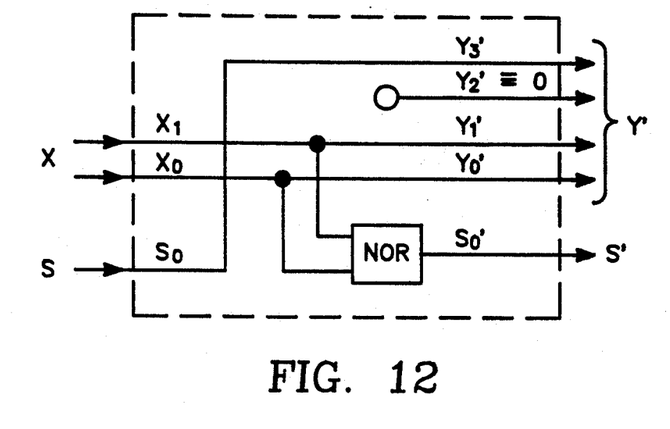
FIG. 12 is a logic diagram of a parity-trit-transformation encoder in accordance with another embodiment of the invention.
Figure 13:
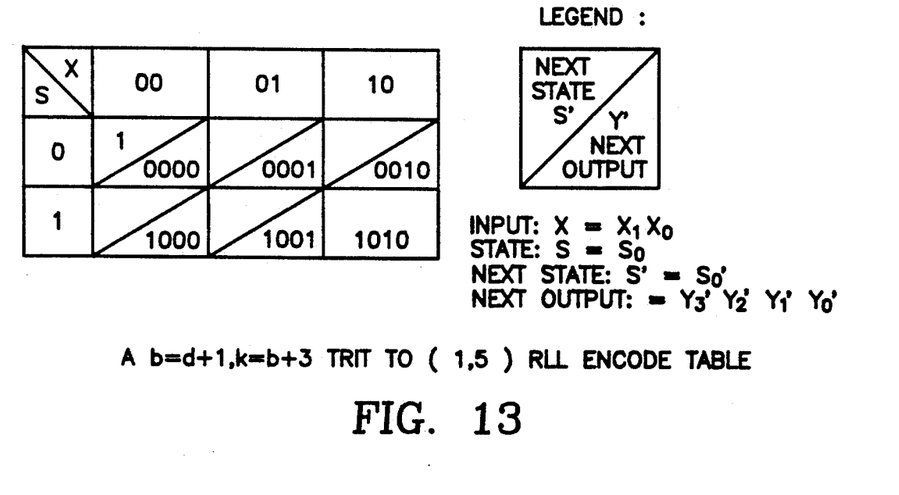
FIG. 13. is a table illustrating the operation of the encoder of FIG. 12.

Thus far we have discussed means for implementing the trit-to-(d,k)-constrained encoding/decoding described earlier in Table II, where b=d and k=2b+3. A trit-to-(1,5)-constrained binary encoder logic network that conforms to the coding described earlier in Table I, where b=d+1 and k=b+3, is shown in FIG. 12. FIG. 13 is a table illustrating the operation of the encoder network of FIG. 12.

Advantages of the Invention

In summary, the parity trit-to-RLL-bit sequence transformation of the present invention employs a bi-state encoder which appends b zeroes ahead of the two-bit word representing the trit value whenever the encoder is in one state and appends either a zero or a one followed by b−1 zeroes ahead of the two-bit word whenever the encoder is in the other state (depending upon whether the codes of Table II or Table I are being used), and sets its state for the encoding of the next trit. The next state is set to 1 if the current trit value is 0 and is set to 0 otherwise.

The RLL binary data thus generated from the parity trits by a properly initialized encoder comprises a check block which may be appended directly to the message block of binary RLL data from which it was computed without violating the (d,k) constraints of the RLL code and without requiring the computation or use of any link bits. (It will be remembered that proper initialization of the encoder is discussed in the foregoing section of this specification entitled Disclosure of the Invention.) Moreover, the computation of the RLL binary data check block requires no algebraic computation.

A related advantage is that the encoding process of the invention meets a requirement of the error correcting code (or shift-correction code) of the above-referenced patent application, namely that a single shift error in the RLL data causes no more than one trit symbol to be in error. In the above-referenced patent application, this result was accomplished by a method entailing significant algebraic computation, which is not necessary in the present invention.

A still further advantage is that the intrinsic encoding rate of trits to RLL bits (i.e., the inverse of the number of RLL bits required to represent each trit) is reasonably close to the theoretical maximum that can be achieved, as will now be explored.

Optimum Encoding Rate of the Invention

The mathematical condition for encoding to be possible at a rate of p random trits to q bits of a (d,k)-constrained RLL code is that $3^p < L(d,k)^q$, where $L(d,k)$ is the largest positive eigenvalue of the transition matrix for the (d,k) RLL code. This condition may also be expressed as:

$$p/q < \log_3 L(d,k).$$

In the case of the (2,7) RLL code, $L(2,7)=1.431$ and $\log_3 1.431 = 0.326$, which is the maximum possible rate (ie., the Shannon capacity) of the trit-to-(2,7)-RLL binary code. Since 0.326 is less than ⅓, encoding is impossible at a rate of one trit to three (2,7)-constrained channel bits, but is possible at a rate of one trit to four such channel bits, which is an encoding rate of ¼. This is precisely the encoding rate of the (2,7) parity trit transformation encoder of FIG. 5.

Now, consider using the system of FIG. 5 in conjunction with a shift-error-correcting ECM code based on a shortened double-error-correcting base 3 BCH code, where the ECM code is used to protect the columns of a 32 byte×32 byte matrix of data. Each data column (assuming a rate ½ modulation code, such as a (2,7) RLL code) would consist of 32×8×2 =512 channel bits. If a (2,7) RLL modulation code were used, these channel bits would give rise to at most 171 trits in the message part of the base 3 BCH code. Since $3^5=243$, and because a double-error-correcting base 3 BCH code of length 243 symbols requires eleven parity trits, and since 171 is less than 243−11, we could use a shortened, length 243 symbol, base 3 BCH code to construct the ECM code.

Using the trit-to-binary-(2,7) code of the foregoing example, the parity portion of the ECM codeword would require a minimum of 4×11=44 channel bits (a code rate of 11/44=0.25 trits/bit). However, since a code rate 2/7 is also less than 0.326 (the Shannon capacity of a trit-to-binary (2,7) RLL code) it is possible that there exists a code that encodes at a rate of two trits to seven (2,7)-constrained channel bits which does not violate the shift-correction-condition (i.e., a code in which one shift error does not affect more than one trit). Such a code, if it exists, would require at least 11/(2/7)=39 channel bits to represent the 11 parity trits, a saving of five channel bits, which translates to a rate increase of 5/(512+44), or less than one percent.

This example, of course, may be hypothetical, in that the existence of such a trit-to-(2,7)-binary code with a coding rate of 2/7 is not assured. However, it does show that the real examples given above in connection with FIGS. 4 and 5 are reasonably close to the theoretical optimum limit for system performance.

Table III illustrates the various encoding rates achieved via the Table I and II codes for various values of b,d and k (and the corresponding computations of the Shannon capacities as previously defined above).

While the invention has been described in detail by specific reference to preferred embodiments thereof, it is understood that variations and modifications thereof may be made without departing from the true spirit and scope of the invention.

TABLE III

| b | Rate | d=b−1 | k=b+3 | L(d,k) | log₃ L(d,k) | d=b | k=2b+3 | L(d,k) | log₃ L(d,k) |
|---|------|-------|-------|--------|-------------|-----|--------|--------|-------------|
| 1 | 1/3  |       |       |        |             | 1   | 5      | 1.570  | .411        |
| 2 | 1/4  | 1     | 5     | 1.570  | .411        | 2   | 7      | 1.431  | .326        |
| 3 | 1/5  | 2     | 6     | 1.412  | .314        | 3   | 9      | 1.354  | .276        |
| 4 | 1/6  | 3     | 7     | 1.325  | .256        | 4   | 11     | 1.304  | .242        |
| 5 | 1/7  | 4     | 8     | 1.269  | .217        | 5   | 13     | 1.269  | .217        |

What is claimed is:

1. A parity symbol-to-modulation codeword encoder which generates, from parity symbols in a finite field, codewords of a modulation code, said codewords comprising runs of bits of a first bit value of minimum length d and maximum length k, said encoder comprising:
    means for receiving a current set of input bits corresponding to a current one of said finite field parity symbols;
    means for appending to said set of input bits a set of b appendage bits so as to form a codeword of said modulation code, said means for appending being in a current state corresponding to one of a set of state values, said appendage bits comprising one of: (a) b bits of said first bit value when said current state corresponds to a first one of said state values, and (b) a binary symbol and b−1 bits of said first bit value when said current state does not correspond to said first state value, wherein said binary symbol is a bit of said first value when said current parity symbol is said first one of said set of parity symbols, and said binary symbol is a bit of a second bit value otherwise, each bit of said first bit value being a zero bit and each bit of said second bit value being a one bit, each codeword of said channel modulation code comprising a run of zero bits, successive ones of said codewords being separated by a one bit; and
    means for setting the state of said appending means for a next set of input bits to one of: (a) a predetermined one of said state values when said current one of said parity symbols is a predetermined one of a set of parity symbols in said finite field, and (b) to an other one of said state values otherwise.

2. The encoder of claim 1 wherein said predetermined one of said set of parity symbols in said finite field is 00 and the remaining parity symbols of said set of 01 and 10, and wherein said first one of said set of parity symbols is 10 and wherein said set of state values comprises two state values.

3. The encoder of claim 1 wherein b satisfies the relationship:

$$d=b, \text{ and } k=2b+3.$$

4. A parity symbol-to-modulation codeword encoder which generates, from parity symbols in a finite field, codewords of a modulation code, said codewords comprising runs of bits of a first bit value of minimum length d and maximum length k, said encoder comprising:
  means for receiving a current set of input bits corresponding to a current one of said finite field parity symbols;
  means for appending to said set of input bits a set of b appendage bits so as to form a codeword of said modulation code, said means for appending being in a current state corresponding to one of a set of state values, said appendage bits comprising one of: (a) b bits of said first bit value when said current state corresponds to a first one of said state values, and (b) a binary symbol and b−1 bits of said first bit value when said current state does not correspond to said first state value, and
  means for setting the state of said appending means for a next set of input bits to one of: (a) a predetermined one of said state values when said current one of said parity symbols is a predetermined one of a set of parity symbols in said finite field, and (b) to an other one of said state values otherwise, wherein said binary symbol is a bit of a second bit value, wherein said appendage bits comprise the most significant bits of said channel word, said binary symbol of said appendage bits being the most significant bit thereof and said set of input bits being the least significant bits thereof, wherein said predetermined one of said set of parity symbols in said finite field is 00 and the remaining parity symbols of said set are 01 and 10 and wherein said set of state values comprises two state values.

5. The encoder of claim 4 wherein b satisfies the following relationship:

$$d=b-1, \text{ and } k=b+3.$$

6. In an error correction modulation code system in which a message block of (d,k)-constrained symbols is converted to a block of elements in a finite field from which a block of parity symbols in said finite field is computed, wherein said block of parity symbols is transformed to a check block of (d,k)-constrained symbols for transmission with said message block through a channel as part of an alternating succession of message blocks and check blocks therein, an encoder for transforming said block of parity symbols in said finite field to said check block of (d,k)-constrained symbols, said encoder comprising:
  means for receiving a current set of input bits corresponding to a current one of said parity symbols of said finite field;
  means for appending to said set of input bits a set of b appendage bits so as to form a (d,k)-constrained symbol, said means for appending being in a current state corresponding to one of a set of state values, said appendage bits comprising one of: (a) b bits of said first bit value when said current state corresponds to a first one of said state values, and (b) a binary symbol and b−1 bits of said first bit value otherwise, wherein said binary symbol is a bit of said first bit value when said current parity symbol is first one of said set of parity symbols, and said binary symbol equals a bit of a second bit value otherwise, wherein each bit of said first bit value is a zero bit and each bit of said second bit value is a one bit, and wherein each (d,k)-constrained symbol comprises a run of zero bits of minimum run length d and maximum run length k, successive ones of said (d,k)-constrained symbols being separated by a one bit; and
  means for setting the state of said appending means for a next set of input bits to one of: (a) a predetermined one of said state values when said current one of said parity symbols is a predetermined one of a set of parity symbols in said finite field, and (b) to the other one of said two state values otherwise.

7. The encoder of claim 6 wherein said predetermined one of said set of parity symbols in said finite field is 00 and the remaining parity symbols of said set are 01 and 10, and wherein said first one of said set of parity symbols is 10 and wherein said set of state values comprises two state values.

8. The encoder of claim 6 wherein b satisfies the following relationship:

$$d=b, \text{ and } k=2b=3.$$

9. The encoder of claim 6 wherein said means for setting said state comprises:
  means responsive whenever said current set of input bits corresponds to a leading (d,k)-constrained symbol of one of said check blocks immediately following the last (d,k)-constrained symbol of a previous one of said message blocks in said channel for initializing the value of said state to a first one of said set of state values if the run length of said last symbol of said previous message block is less than d and for initializing said state to another one of said set of state values otherwise.

10. The encoder of claim 6 wherein said means for appending comprise means for generating the most significant bit to be appended to said two-bit word, said means for generating said most significant bit comprising:
  an AND gate having two logic inputs, one of said logic inputs of said AND gate being controlled by the logical inverse of said state value and the other of said logic inputs of said AND gate being controlled by the most significant bit of said current set of input bits.

11. The encoder of claim 6 wherein said system further comprises a decoder which back-transforms said (d,k)-constrained symbols formed by said means for appending into said set of input bits, said decoder comprising:
  means for stripping the bits appended by said means for appending from said set of input bits and for transmitting said set of input bits.

12. The encoder of claim 6 wherein said means for appending comprises:
  means responsive whenever said current set of input bits corresponds to a last (d,k)-constrained symbol of one of said check blocks immediately preceding the first (d,k)-constrained symbol of a next one of said message blocks in said channel for inserting a linking (d,k)-constrained symbol between said check block and said message block corresponding to a third, fourth or fifth one of said set of parity symbols whenever the run length of said first (d,k)-constrained symbol of said next message block is less than, equal to or greater than d−1, respectively.

13. The encoder of claim 12 wherein said third, fourth and fifth ones of said set of parity symbols are 01, 10 and 00, respectively.

14. In an error correction modulation code system in which a message block of (d,k)-constrained symbols is converted to a block of elements in a finite field from which a block of parity symbols in said finite field is computed, wherein said block of parity symbols is transformed to a check block of (d,k)-constrained symbols for transmission with said message block through a channel as part of an alternating succession of message blocks and check blocks therein, an encoder for transforming said block of parity symbols in said finite field to said check block of (d,k)-constrained symbols, said encoder comprising:

means for receiving a current set of input bits corresponding to a current one of said parity symbols of said finite field;

means for appending to said set of input bits a set of b appendage bits so as to form a (d,k)-constrained symbol, said means for appending being in a current state corresponding to one of a set of state values, said appendage bits comprising one of: (a) b bits of said first bit value when said current state corresponds to a first one of said state values, and (b) a binary symbol and b−1 bits of said first bit value otherwise, and means for setting the state of said appending means for a next set of input bits to one of: (a) a predetermined one of said state values when said current one of said parity symbols is a predetermined one of a set of parity symbols in said finite field, and (b) to the other one of said two state values otherwise, wherein said binary symbol being a bit of a second bit value, said binary symbol is a bit of a said first bit value when said current parity symbol is first one of said set of parity symbols, said binary symbol equaling a bit of a second bit value otherwise, wherein said predetermined one of said set of parity symbols in said finite field is 00 and the remaining parity symbols of said set are 01 and 10 and wherein said set of state values comprises two state values.

15. The encoder of claim 14 wherein b satisfies the following relationship:

$d=b-1$, and $k=b+3$.

16. A parity symbol-to-modulation codeword encoding method for generating, from parity symbols in a finite field, codewords of a modulation code, said codewords comprising runs of bits of a first bit value of minimum length d and maximum length k, said method comprising the steps of:

receiving a current set of input bits corresponding to a current one of said finite field parity symbols;

appending to said set of input bits a set of b appendage bits so as to form a codeword of said modulation code in accordance with a state, said appendage bits comprising one of: (a) b bits of said first bit value when said state corresponds to a first one of a set of state values, and (b) a binary symbol and b−1 bits of said first bit value otherwise, wherein said binary symbol is a bit of said first bit value when said current parity symbol is first one of said set of parity symbols, and said binary symbol is a bit of a second bit value otherwise, wherein each bit of said first bit value is a zero bit and each bit of said second bit value is a one bit, and wherein each codeword of said channel modification code comprises a run of zero bits, successive ones of said codewords being separated by a one bit; and setting said state to one of: (a) a predetermined one of said state values if said current one of said parity symbols is a predetermined one of a set of parity symbols in said finite field, and (b) to an other one of said state values otherwise.

17. The method of claim 16 wherein said predetermined one of said set of parity symbols in said finite field is 00 and the remaining parity symbols of said set are 01 and 10 and wherein said first one of said set of parity symbols is 10 and wherein said set of state values comprises two state values.

18. The method of claim 16 wherein be satisfies the following relationship:

$d=b, k=2b+3$.

19. A parity symbol-to-modulation codeword encoding method for generating, from parity symbols in a finite field, codewords of a modulation code, said codewords comprising runs of bits of a first bit value of minimum length d and maximum length k, said method comprising the steps of:

receiving a current set of input bits corresponding to a current one of said finite field parity symbols;

appending to said set of input bits a set of b appendage bits so as to form a codeword of said modulation code in accordance with a state, said appendage bits comprising one of: (a) b bits of said first bit value when said state corresponds to a first one of a set of state values, and (b) a binary symbol and b−1 bits of said first bit value otherwise; and setting said state to one of: (a) a predetermined one of said state values if said current one of said parity symbols is a predetermined one of a set of parity symbols in said finite field, and (b) to an other one of said state values otherwise, wherein said binary symbol is a bit of a second bit value, said appendage bits comprise the most significant bits of said channel word, said binary symbol of said appendage bits being the most significant bit thereof and said set of input bits being the least significant bits thereof, wherein said predetermined one of said set of parity symbols in said finite field is 00 and the remaining parity symbols of said set are 01 and 10 and wherein said set of state values comprises two state values.

20. The method of claim 19 wherein b satisfies the following relationship:

$d=b-1$, and $k=b+3$.

21. In an error correction modulation code system in which a message block of (d,k)-constrained symbols is converted to a block of elements in a finite field from which a block of parity elements in said finite field is computed, wherein said block of parity elements is transformed to a check block of (d,k)-constrained symbols for transmission with said message block through a channel as part of an alternating succession of message blocks and check blocks therein, a method for transforming said block of parity elements in said finite field to said check block of (d,k)-constrained symbols, said method comprising the steps of:

receiving a current set of input bits corresponding to a current one of said parity symbols of said finite field;

appending to said set of input bits a set of b appendage bits so as to form a (d,k)-constrained symbol in accordance with a current state corresponding to one of a set of state values, said appendage bits comprising one of: (a) b bits of said first bit value when said current state corresponds to a first one of said state values, and (b) a binary symbol and $b-1$ bits of said first bit value otherwise, wherein said binary symbol is a bit of said first bit value when said current parity symbol is a first one of said set of parity symbols, said binary symbol equalling a bit of a second value otherwise, wherein each bit of said first bit value is a zero bit and each bit of said second bit value is a one bit, and wherein each (d,k)-constrained symbol comprises a run of zero bits of minimum run length d and maximum run length k, successive ones of said (d,k)-constrained symbols being separated by a one bit; and setting said state to one of: (a) a predetermined one of said state value if said current one of said parity symbols is a predetermined one of a set of parity symbols in said finite field, and (b) to an other one of said state values otherwise.

22. The method of claim 21 wherein said predetermined one of said set of parity symbols in said finite field is 00 and the remaining parity symbols of said set are 01 and 10, and wherein said first one of said set of parity symbols is 10 and wherein said set of state values comprises two state values.

23. The method of claim 21 wherein b satisfies the following relationship:

$d=b$, and $k=2b+3$.

24. The method of claim 21 wherein the step of setting said state comprises:

whenever said current set of input bits is to be transformed to a leading (d,k)-constrained symbol of one of said check blocks immediately following a last (d,k)-constrained symbol of a previous one of said message blocks in said channel, initializing the value of said state to a first one of said set of state values if the run length of said last symbol of said previous message block is less than d and initializing said state to an other one of said set of state values otherwise.

25. The method of claim 21 further comprising:

whenever said current set of input bits is to be transformed to a last (d,k)-constrained symbol of one of said check blocks immediately preceding the first (d,k)-constrained symbol of a next one of said message blocks in said channel, inserting a linking (d,k)-constrained symbol between said check block and said message block corresponding to a third, fourth or fifth one of said set of parity symbols whenever the run length of said first (d,k)-constrained symbol of said next message block is less than, equal to or greater than $d-1$, respectively.

26. The method of claim 25 wherein said third, fourth and fifth ones of said set of parity symbols are 01, 10 and 00, respectively.

27. The method of claim 21 wherein each input set of bits is followed by a successive input set of bits, said method further comprising repeating the sensing, receiving, generating, appending and setting steps for each successive input set of bits;

wherein said generating step is carried out with a first value of b for initial ones of said sets of input bits and a second value of b for the remaining sets of input bits.

28. The method of claim 27 wherein:

said first value of b satisfies $d=b-1$ and $k=b+3$; and
said second value of b satisfies $d=b$ and $k=2b+3$.

29. The method of claim 28 wherein said initial symbols are one of: (a) the leading symbol of said check block or (b) the first and second leading symbols of said check block.

30. In an error correction modulation code system in which a message block of (d,k)-constrained symbols is converted to a block of elements in a finite field from which a block of parity elements in said finite field is computed, wherein said block of parity elements is transformed to a check block of (d,k)-constrained symbols for transmission with said message block through a channel as part of an alternating succession of message blocks and check blocks therein, a method for transforming said block of parity elements in said finite field to said check block of (d,k)-constrained symbols, said method comprising the steps of:

receiving a current set of input bits corresponding to a current one of said parity symbols of said finite field;

appending to said set of input bits a set of b appendage bits so as to form a (d,k)-constrained symbol in accordance with a current state corresponding to one of a set of state values, said appendage bits comprising one of: (a) b bits of said first bit value if said current state corresponds to a first one of said state values, and (b) a binary symbol and $b-1$ bits of said first bit value otherwise, wherein said binary symbol is a bit of a second value; and setting said state to one of: (a) a predetermined one of said state values when said current one of said parity symbols is a predetermined one of a set of parity symbols in said finite field, and (b) to an other one of said state values otherwise, wherein said appendage bits comprise the most significant bits of said (d,k)-constrained symbol formed by the appending step, said binary symbol of said appendage bits being the most significant bit thereof and said set of input bits being the least significant bits thereof, wherein said predetermined one of said set of parity symbols of said set are 01 and 10 and wherein said set of state values comprises two state values.

31. The method of claim 30 wherein b satisfies the following relationship:

$d=b-1$, and $k=b+3$.

* * * * *